Sept. 23, 1969 M. A. STACEY ET AL 3,468,017

METHOD OF MANUFACTURING GATE CONTROLLED SWITCHES

Filed Nov. 15, 1966

INVENTOR.
Michael Albert Stacey
David Everitt Millington
BY Blascock, Downing & Seebold
ATTORNEYS United States Patent Office 3,468,017
Patented Sept. 23, 1969

3,468,017
METHOD OF MANUFACTURING GATE CONTROLLED SWITCHES

Michael Albert Stacey, Kenilworth, and David Everitt Millington, Henley-in-Arden, England, assignors to Joseph Lucas (Industries) Limited, Birmingham, England Filed Nov. 15, 1966, Ser. No. 594,559
Claims priority, application Great Britain, Dec. 6, 1965, 51,621/65
Int. Cl. H01h *11/00;* B01j *17/00*
U.S. Cl. 29—571 4 Claims

ABSTRACT OF THE DISCLOSURE

A gate controlled switch is formed by diffusing a p-type impurity into opposite faces of an n-type slice to form a p-n-p wafer with the p-layers acting as the anode and the gate, and then forming a diffused n-type region in the gate region to act as the cathode, the exposed portions of the gate and cathode regions being plated to provide electrodes. The initial diffusion of the p-type impurity is carried out in a reducing atmosphere, and after the formation of the cathode region further p-type impurity is diffused into the gate region to increase the concentration of the p-type impurity. In addition, the p-n junction is subjected to an etching process to increase the breakdown voltage of the junction, all these factors contributing to the performance of the gate controlled switch.

Figure 1:
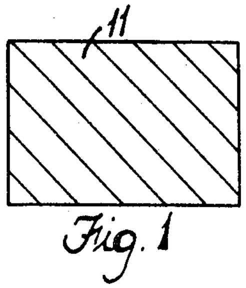

This invention relates to gate controlled switches, (i.e.) thyristors which have the additional property that they can be turned off by negative gate-cathode current.

In our Patent No. 3,223,560 we have described a method of manufacturing a thyristor in which p-type impurity is diffused into opposite faces of a silicon slice to produce a p-n-p slice in which the p-type layers act in use as the anode and gate respectively, n-type impurity then being diffused into part of the gate layer to produce a cathode layer defining a p-n peripheral junction with the gate layer. In order to afford the thyristor the properties of a gate controlled switch, the p-n junction has its berakdown voltage increased by an etching process, and as an important subsidiary feature the concentration of p-type impurity in the gate layer is increased before the etching process. A further improvement in the properties of a gate controlled switch is provided by plating the gate and cathode layers to provide electrodes thereto.

The regions in a semi-conductor device are not of course precisely defined, but it is convenient in order to explain the theory underlying the present invention to regard the n-type cathode layer as being rectangular in section and extending partly within the p-type gate layer. Research has now shown that for best results the concentration of p-type impurity at the p-n gate-cathode junction must be as high as possible. This desideratum is partly achieved in Patent No. 3,223,560 by increasing the p-concentration of the gate layer, but, considering the regions of the wafer to extend horizontally, this increase in p-type concentration has no effect on the horizontal portion of the p-n junction. In fact, in the said patent the gate layer is formed by an aluminium diffusion in vacuum followed by a further diffusion period in an oxidising atmosphere with the aluminium source removed. This process results in a maximum p-concentration below the surface of the slice, and consequently below the p-n junction when the cathode layer is formed subsequently. This technique is of great advantage in manufacturing transistors and thyristors, but it is now appreciated that it is a disadvantage in the manufacture of a gate controlled switch.

The present invention is concerned essentially with ensuring that the p-concentration along the horizontal portion of the junction is kept as high as possible. This is achieved by carrying out the diffusion of the gate layer in a reducing atmosphere.

It should not be thought that the method described in Patent No. 3,223,560, which was at that time thought to be the best method of producing a gate controlled switch, is inoperative. The difference between the two methods can be seen by considering the example quoted in Patent No. 3,223,560, in which a gate controlled switch was required to turn off a current of five amps and for this purpose was etched to provide a gate-cathode breakdown voltage of fifty volts. An equivalent method according to the present invention produces a similar gate controlled switch, but it is only necessary to etch the gate-cathode junction to a breakdown voltage of fifteen volts. Thus, the etching time is reduced, as is the diffusion time for the gate layer.

An example of the invention will now be described with reference to the accompanying drawings, in which FIGURES 1 to 8 illustrate diagrammatically eight stages during the manufacture of a gate controlled switch.

Referring to the drawings, a wafer 11 (FIGURE 1) is first cut from an n-type crystal of silicon with the wafer surface in the 1, 1, 1, crystal plane. The resistivity of the silicon in a typical case is in the region of 30–50 ohm-cms., the silicon having a dislocation density less than $10^4$ per square centimetre. The wafer is lapped to a thickness of, for example 0.016 inch, and then etched to a thickness of 0.0135 inch in an acid solution comprising by volume:

| | Parts |
|---|---|
| Concentrated nitric acid | 5 |
| Glacial acetic acid | 3 |
| Hydrofluoric acid (40%) all of Analar standard | 3 |

Figure 2:
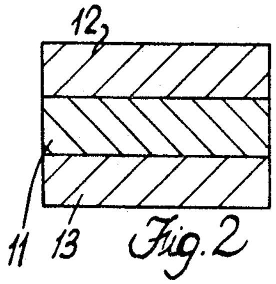

After the etching process, the wafer is placed in a furnace, which is then evacuated to a pressure better than one micron of mercury pressure and then filled to a pressure of 200 microns with a dry, oxygen free mixture of 90% argon and 10% hydrogen by volume. The furnace is then heated and aluminium vapour is diffused into opposite faces of the crystal to form first and second p-type layers 12, 13 (FIGURE 2). A typical diffusion time is five hours with a surface concentration of at least $5\times10^{18}$ per cm.$^3$ with the furnace maintained at 1200° C., and the aluminium source at 1150° C., after which the wafer is cooled at a rate of about 5° C., per minute to atmospheric temperature, and then removed from the furnace.

The wafer is now placed in an open-tube furnace at 1250° C., in an atmosphere of phosphorus pentoxide and air, the furnace being allowed to cool to atmospheric temperature immediately at a rate of 5° C., per minute. This process results in the formation of thin n-type layers 16, 17 on the p-type layers 12, 13 the n-type layers 16, 17 being themselves covered by glass layers 18, 18*a* (FIGURE 3) consisting of a mixture of silicon and phosphorus oxides formed by oxidation.

Figures 3, 4, 5:
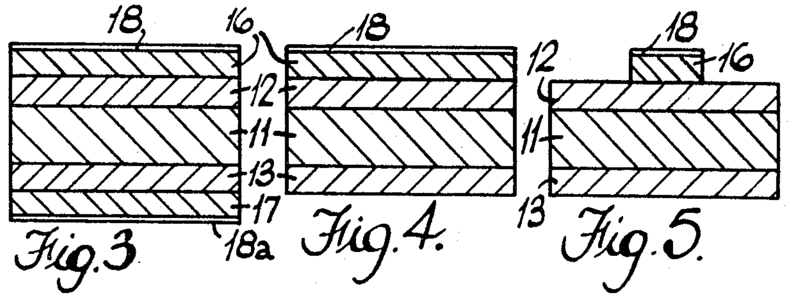

The glass and n-type layers 18*a*, 17 covering the p-type layer 13 are removed by etching first in hydrofluoric acid and then in the above-defined acid mixture, the wafer then appearing as shown in FIGURE 4.

The glass-like and n-type layers 16, 18 are now covered with a protective layer of wax of a predetermined shape, depending on the required shape of the junction between the gate and cathode in the finished rectifier. The exposed surface is now treated as before to remove the layers 16, 18, the wax then being removed, leaving a wafer of the form shown in FIGURE 5. Preferably, the junction between the gate and the cathode is tortuous in shape, so that a large peripheral length is provided for a given area.

The wafer is now placed in a furnace of 1250° C., and boron vapour is passed over the wafer. Boron diffuses into the wafer except for that portion masked by the glass-like substances. After two hours in this furnace the temperature is allowed to cool at 2½° C. per minute to room temperature. The result of this process is that the p-type layer 13 and the exposed portion of the p-type layer 12 have concentrated p-type layers 19, 20 formed in them of surface concentration $10^{18}$ per $cm.^3$, the layers 19, 20 being coated with glass layers 21, 22, the wafer now having the form shown in FIGURE 6.

The layer 21 is now removed, and the anode layer covered with gold by a plating or evaporation process. Diffusion is carried out at a temperature in the range 830–900° C., in an oxygen-free atmosphere of 90% argon and 10% hydrogen by volume. The wafer is then cooled by placing it in the atmosphere, washed in hydrofluoric acid to remove the glass layers, washed in aqua regia to remove excess gold, and then washed again in hydrofluoric acid to remove the oxide film left by the aqua regia. The effect of the gold diffusion is to reduce the turn off time and to enable the turn-off gain to be increased.

Figures 6, 7, 8:
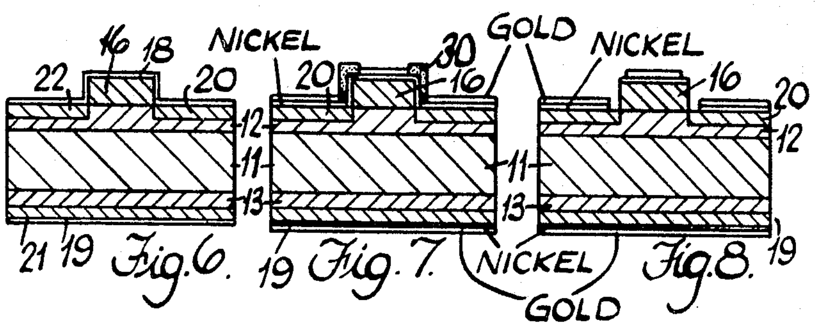

The wafer is now nickel plated, so that it still has the form shown in FIGURE 6, but the glass layers are replaced by layers of nickel plating. The peripheral p-n junction between the gate and cathode is masked with a wax or photoresist as shown at 30, after which the wafer is gold plated. The mask is then removed, and the p-n junction is subjected to an etching process to remove the nickel across the junction and increase the breakdown voltage of the junction, the acid mixture previously specified being used and the gold plating acting as a mask.

Several devices are made in one wafer and these are cut from the wafer by masking with wax and acid etching.

Having thus described our invention what we claim as new and desire to secure by Letters Patent is:

1. A method of manufacturing a gate controlled switch, comprising the following steps:

(i) diffusing p-type impurity into opposite faces of an n-type crystal wafer to form a p-n-p wafer in which one p-type layer is to act as the anode and the other p-type layer is to act as the gate, the diffusion being carried out in a reducing atmosphere;

(ii) forming in part of the gate region a diffused n-type region which is to act as the cathode and which defines with the gate region a peripheral p-n junction;

(iii) diffusing further p-type impurity into the gate region to increase the concentration of p-type impurity in the surface thereof;

(iv) plating the exposed portions of the gate and cathode regions to provide electrodes thereto, and (v) subjecting said p-n junction to an etching process to increase the breakdown voltage of the junction.

2. A method as claimed in claim 1 including the step of diffusing gold into the anode region between stages (iii) and (iv).

3. A method as claimed in claim 1 in which the exposed portion of the anode region is plated to provide an electrode thereto.

4. A method as claimed in claim 1 in which the n-type cathode region is formed by diffusing an n-type impurity into the entire gate region and then exposing the gate region except where the cathode is required.

References Cited

UNITED STATES PATENTS

| | | | |
|---|---|---|---|
| 2,873,222 | 2/1959 | Derick. | |
| 2,945,286 | 7/1960 | Dorendorf. | 29—580 X |
| 3,042,565 | 7/1962 | Lehovec. | |
| 3,249,831 | 5/1966 | New et al. | |

JOHN F. CAMPBELL, Primary Examiner

W. I. BROOKS, Assistant Examiner

U.S. Cl. X.R.

29—590; 148—189